United States Patent
Goto et al.

(10) Patent No.: US 7,372,080 B2
(45) Date of Patent: May 13, 2008

(54) GAN SEMICONDUCTOR DEVICE

(75) Inventors: Osamu Goto, Miyagi (JP); Osamu Matsumoto, Miyagi (JP); Tomomi Sasaki, Miyagi (JP); Masao Ikeda, Miyagi (JP)

(73) Assignee: Sony Corporation, Tokyo (JP)

( * ) Notice: Subject to any disclaimer, the term of this patent is extended or adjusted under 35 U.S.C. 154(b) by 82 days.

(21) Appl. No.: 10/517,877

(22) PCT Filed: Jun. 19, 2003

(86) PCT No.: PCT/JP03/07822

§ 371 (c)(1),
(2), (4) Date: Aug. 12, 2005

(87) PCT Pub. No.: WO04/001920

PCT Pub. Date: Dec. 31, 2003

(65) Prior Publication Data

US 2006/0097278 A1 May 11, 2006

(30) Foreign Application Priority Data

Jun. 20, 2002 (JP) .............................. 2002-179875

(51) Int. Cl.
H01L 29/22 (2006.01)
H01L 33/00 (2006.01)

(52) U.S. Cl. ............................ 257/99; 257/13; 257/81; 257/103

(58) Field of Classification Search ................. 257/13, 257/81–82, 97, 103, 94, E33.001, E33.003, 257/E33.062, E33.012, E33.014, 99
See application file for complete search history.

(56) References Cited

U.S. PATENT DOCUMENTS

| | | | |
|---|---|---|---|
| 6,111,277 A | 8/2000 | Ikeda | |
| 6,855,959 B2 * | 2/2005 | Yamaguchi et al. | 257/98 |
| 7,015,058 B2 * | 3/2006 | Takatani et al. | 438/41 |
| 2002/0030200 A1 * | 3/2002 | Yamaguchi et al. | 257/184 |
| 2002/0064195 A1 * | 5/2002 | Takeya et al. | 372/45 |

FOREIGN PATENT DOCUMENTS

| | | |
|---|---|---|
| EP | 1088914 | 4/2001 |
| JP | 2000-164929 | 6/2000 |
| JP | 2001-102303 | 4/2001 |
| JP | 2003-124572 | 4/2003 |

* cited by examiner

*Primary Examiner*—Zandra V. Smith
*Assistant Examiner*—Thanh Y. Tran
(74) *Attorney, Agent, or Firm*—Robert J. Depke; Rockey, Depke & Lyons, LLC.

(57) ABSTRACT

Provided is a GaN-based semiconductor light emitting device formed on a GaN single-crystal substrate and having a configuration capable of reducing a current leak.

A GaN-based semiconductor laser device (50) is disclosed as an example of the GaN-based semiconductor light emitting device, and it is a semiconductor laser device having a structure such that a p-side electrode and an n-side electrode are provided on a multilayer structure of GaN-based compound semiconductor layers. The GaN-based semiconductor laser device (50) is similar in configuration to a conventional GaN-based semiconductor laser device formed on a sapphire substrate except that a GaN single-crystal substrate (52) is used in place of the sapphire substrate and that the multilayer structure is directly formed on the GaN single-crystal substrate (52) without providing a GaN-ELO structure layer. The GaN single-crystal substrate (52) has continuous belt-shaped core portions (52a) each having a width of 10 μm. These core portions (52a) are spaced apart from each other by a distance of about 400 μm. A laser stripe (30), a pad metal (37) for the p-side electrode (36), and the n-side electrode (38) are provided on the multilayer structure in a region except the core portions (52a) of the GaN single-crystal substrate (52). The horizontal distance Sp between the pad metal (37) and the core portion (52a) adjacent thereto is 95 μm, and the horizontal distance Sn between the n-side electrode (38) and the core portion (52a) adjacent thereto is also 95 μm.

12 Claims, 13 Drawing Sheets

Fig.1A
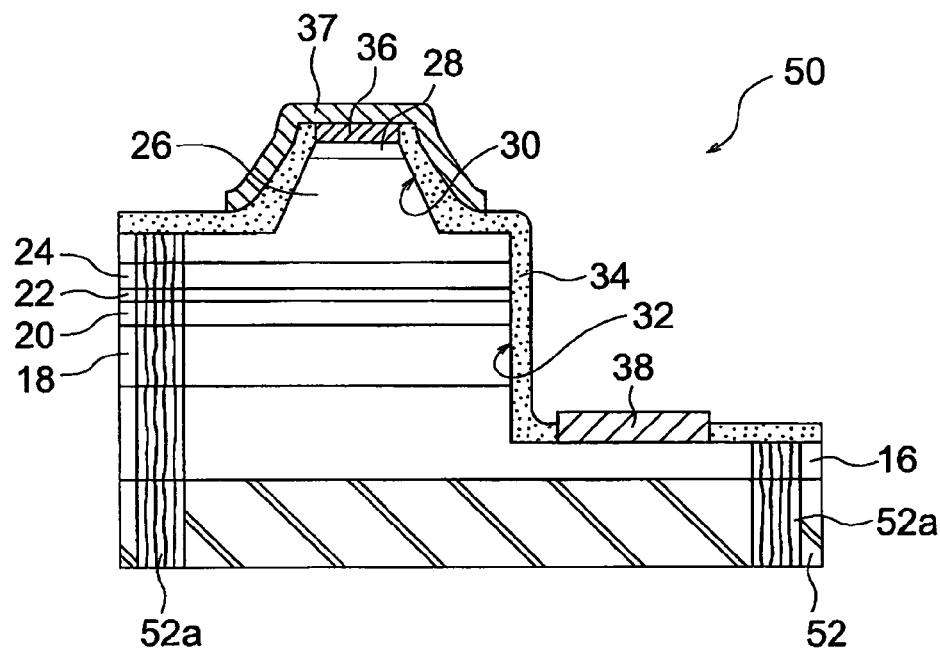
(b)
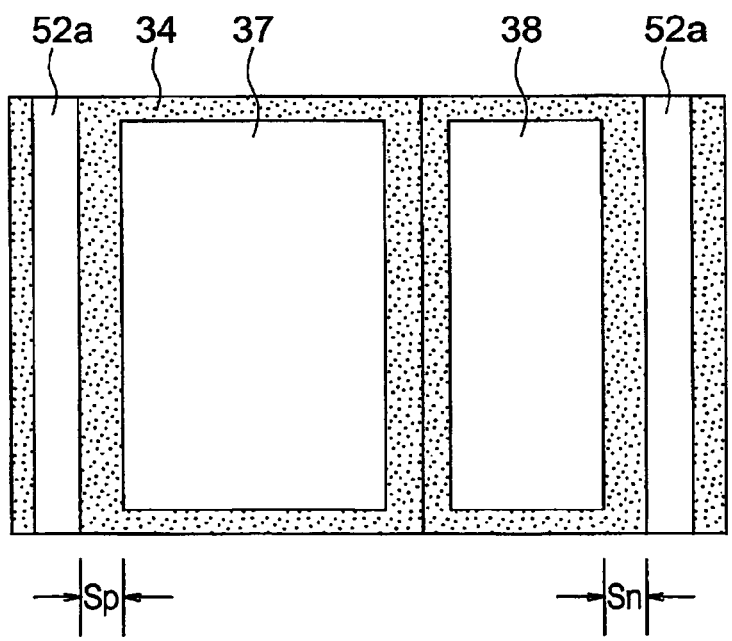
Fig.1B

GAN SEMICONDUCTOR DEVICE

This application claims priority to Japanese Patent Application Number JP2002-179875, filed Jun. 20, 2002 which is incorporated herein by reference.

TECHNICAL FIELD

The present invention relates to a GaN-based semiconductor device, and more particularly to a GaN-based semiconductor device which can reduce a current leak. Further, the invention relates to a GaN-based semiconductor light emitting device which can reduce a current leak to improve a light emission efficiency.

BACKGROUND ART

A III-V gallium nitride (GaN)-based compound semiconductor such as GaN, GaInN, and AlGaInN has a wide bandgap of 2.8 to 6.8 eV, and attention is focused on such a GaN-based compound semiconductor as the material of a semiconductor light emitting device capable of emitting light in a red to UV region.

As a GaN-based semiconductor light emitting device using a III-V GaN-based compound semiconductor as a component, a blue or green light emitting diode (LED) and a GaN-based semiconductor laser device oscillating in a violet region of about 405 nm, for example, have been developed and put into practical use.

One problem in fabrication of a GaN-based semiconductor light emitting device is that it is difficult to find a substrate lattice-matched to GaN-based compound semiconductor layers. At present, a sapphire substrate is frequently used as the substrate for the GaN-based semiconductor light emitting device.

The reasons for such frequent use of the sapphire substrate are that the sapphire substrate has chemical stability required in crystal growth of the GaN-based compound semiconductor layers at a growing temperature of about 1000° C., that the crystal quality is good, and that a substrate having a relatively large diameter can be supplied economically and stably.

The lattice constant of the sapphire substrate is different 10% or more from the lattice constant of GaN. Therefore, in forming the GaN-based semiconductor light emitting device on the sapphire substrate, a buffer layer such as a GaN layer is generally grown on the sapphire substrate at a low temperature, and a GaN-based compound semiconductor single-crystal is grown on this low-temperature buffer layer, thereby relaxing the difference in lattice constant.

However, even by providing the low-temperature buffer layer and growing the GaN-based compound semiconductor layers on the low-temperature buffer layer, the density of crystal defects becomes high. Accordingly, it is difficult to grow high-quality GaN-based compound semiconductor layers, so that it is difficult to fabricate the GaN-based semiconductor light emitting device with high reliability.

To solve this problem, GaN-ELO (Epitaxially Laterally Overgrowth) is performed in addition to the interposition of the low-temperature buffer layer. Thus, a GaN-ELO structure layer is formed and the GaN-based compound semiconductor layers are grown on this GaN-ELO structure layer.

Referring to FIG. 5, there is shown a sectional structure of a GaN-based semiconductor laser device having such a GaN-ELO structure layer formed on a sapphire substrate.

FIG. 5 is a sectional view showing the configuration of the GaN-based semiconductor laser device using the sapphire substrate.

As shown in FIG. 5, the GaN-based semiconductor laser device 10 includes the sapphire substrate 12, the GaN-ELO structure layer 14 formed on the sapphire substrate 12 by ELO, and a multilayer structure composed of an n-type GaN contact layer 16, n-type AlGaN clad layer 18, n-type GaN guide layer 20, GaInN active layer 22 having a multiple quantum well (MQW) structure, p-type GaN guide layer 24, p-type AlGaN clad layer 26, and p-type GaN contact layer 28 sequentially grown on the GaN-ELO structure layer 14 by MOCVD.

An upper portion of the p-type AlGaN clad layer 26 and the p-type GaN contact layer 28 are formed as a stripe-shaped ridge 30 located between a seed crystal portion and a junction portion of the GaN-ELO structure layer 14.

Further, the remaining portion of the p-type AlGaN clad layer 26, the p-type GaN guide layer 24, the active layer 22, the n-type GaN guide layer 20, the n-type AlGaN clad layer 18, and an upper portion of the n-type GaN contact layer 16 are formed as a mesa 32 parallel to the ridge 30.

An $SiO_2$ film 34 having an opening at a position over the p-type GaN contact layer 28 is deposited on the opposite side surfaces of the ridge 30 and on the remaining portion of the p-type AlGaN clad layer 26.

A p-side electrode 36 of a Pd/Pt multilayer metal film is formed on the p-type GaN contact layer 28. A pad metal 37 is provided as a leading electrode on the $SiO_2$ film 34 so as to be electrically connected through the opening of the $SiO_2$ film 34 to the p-side electrode 36. With this structure, a low-resistance Schottky p-side electrode can be formed. The pad metal 37 is formed from a Ti/Pt/Au multilayer metal film.

Further, an n-side electrode 38 of a Ti/Pt/Au multilayer metal film is provided on the n-type GaN contact layer 16 so as to be exposed to another opening of the $SiO_2$ film 34.

The lattice mismatch between the sapphire substrate and the GaN-based compound semiconductor layers is relaxed by adopting the ELO process as mentioned above. However, any other problems associated with the lattice mismatch remain as far as the sapphire substrate is used as the substrate of the GaN-based semiconductor light emitting device. Further, since the sapphire substrate is dielectric, there is a limit to the arrangement of the electrodes.

Accordingly, it is strongly desired to realize a GaN substrate. However, it is conventionally very difficult to industrially fabricate a GaN substrate having a large diameter with reduced crystal defects which can be used as the substrate of the GaN-based semiconductor light emitting device.

Such a large-diameter GaN substrate based on a novel technique has recently been on the way to realization.

The configuration of a novel GaN substrate will now be described with reference to FIGS. 6A and 6B. FIGS. 6A and 6B are a perspective view and a sectional view of a GaN substrate, respectively, for illustrating core portions and a low-density defect region.

As shown in FIG. 6, the GaN substrate 40 has a low-density defect region 42 and a high-density defect region (which will be hereinafter referred to also as core portions) 44 having a crystal defect density higher than that of the surrounding low-density defect region 42. The core portions 44 are periodically arranged on the substrate surface and passed through the thickness of the substrate.

The arrangement pattern of the core portions 44 is not fixed, but it may include dotted dispersive patterns such as a hexagonal lattice pattern shown in FIG. 7A, a square lattice pattern shown in FIG. 7B, and a rectangular lattice pattern shown in FIG. 7C.

The arrangement pattern of the core portions is not limited to the above-mentioned intermittent or dispersive patterns, but may include an intermittent linear pattern of dotted core portions 44 as shown in FIG. 8A and a continuous linear pattern of belt-shaped core portions 44 as shown in FIG. 8B.

The above-mentioned GaN substrate has been developed by improving the technique disclosed in Japanese Patent Laid-open No. 2001-102307 and controlling the positions of the core portions generated in the low-density defect region.

The basic mechanism of crystal growth of a GaN single-crystal will now be described. The GaN single-crystal is grown with an inclined facet being maintained, thereby propagating dislocations and gathering them to a predetermined position. The region grown by this facet becomes a low-density defect region owing to the movement of dislocations.

On the other hand, a high-density defect region (core portions) having a clear boundary is generated and grown under the inclined facet, and the dislocations are gathered at the boundary of the high-density defect region or inside thereof, then disappearing or being accumulated.

The shape of the facet differs according to the shape of the high-density defect region. In the case that the high-density defect region has a dotted pattern, each dot forms a bottom surrounded by the facet to form a pit by the facet.

In the case that the high-density defect region has a striped pattern, each stripe forms a valley having inclined facets on the opposite sides. These facets are opposite surfaces of a triangular prism in its laid condition.

Further, the high-density defect region may have some states. For example, the high-density defect region may be polycrystalline. Further, the high-density defect region may be a single crystal and minutely inclined with respect to the surrounding low-density defect region. Further, there is a case that the C-axis of the single crystal is inverted with respect to the surrounding low-density defect region. The high-density defect region has a clear boundary and it can be distinguished from the surrounding low-density defect region.

The crystal growth of the GaN single-crystal can be advanced with the surrounding facet being not buried but maintained.

Thereafter, the surface of the GaN grown layer is ground and polished to become a flat surface which can be used as a substrate surface.

The high-density defect region (core portions) may be formed by preliminarily forming a seed at a position where each core portion is to be formed in the crystal growth of GaN on a base substrate.

The seed may be formed by forming an amorphous or polycrystalline layer in a minute region. By epitaxially growing GaN on this amorphous or polycrystalline layer, the high-density defect region or core portion can be formed in the above seed region.

A specific manufacturing method for the GaN substrate will now be described. First, a base substrate on which a GaN layer is to be grown is prepared. The composition of the base substrate is not limited. For example, a general sapphire substrate may be used. However, in consideration of removal of the base substrate in a subsequent step, a GaAs substrate or the like is preferable.

Thereafter, seeds of $SiO_2$ layers, for example, are formed regularly, e.g., periodically on the base substrate. The pattern of the seeds is a dotted pattern or a striped pattern according to the shape and pattern of the core portions.

Thereafter, a thick film of GaN is grown by HVPE (Hydride Vapor Phase Epitaxy). After growth of the thick film, facets are formed on the surface according to the pattern of the seeds. For example, in the case that the pattern of the seeds is a dotted pattern, pits by the facets are regularly formed. In the case that the pattern of the seeds is a striped pattern, prismatic facets are formed.

After growing the thick GaN layer, the base substrate is removed and the thick GaN layer is next ground and polished to obtain a flat substrate surface, thus fabricating the GaN substrate. The thickness of the GaN substrate can be freely set.

In such a GaN substrate fabricated above, the c-plane is a principal plane, and dotted or striped core portions each having a predetermined size are regularly formed. The GaN single-crystal region except the core portions is a low-density defect region having a dislocation density remarkably lower than that in the core portions.

The GaN substrate prepared by the above method has good crystallinity similar to that of the GaN layer grown by applying the ELO process. Further, the width of the low-density defect region in the GaN substrate is ten times or more the width of the low-density defect region in the GaN layer grown by the ELO process, and the width of the high-density defect region (each core portion) in the GaN substrate is narrower (e.g., tens of micrometers) than that in the GaN layer grown by the ELO process.

For example, a (0001) n-type GaN substrate has been developed such that core portions are spaced by a distance of 400 μm so as to extend in a [1-100] direction, and that a low-density defect region is present between the adjacent core portions. The dislocation density in the (0001) n-type GaN substrate developed above in relation to the distance (μm) from the center of one of the adjacent core portions is shown in FIG. 9. As apparent from FIG. 9, the region having a dislocation density of less than $1.0 \times 10^6$ cm$^{-2}$ is present in the range of more than 150 μm, and the minimum dislocation density in this region is $2.8 \times 10^5$ cm$^{-2}$. In FIG. 9, the value 0 on the horizontal axis means the center of one of the adjacent core portions, and the value 400 on the horizontal axis means the center of the other core portion.

Thus, the GaN substrate is a substrate having excellent crystallinity as mentioned above. Accordingly, attempts are actively being made to fabricate a GaN-based semiconductor laser device using the GaN substrate, e.g., a GaN-based semiconductor laser device having the same multilayer structure as that of the above-mentioned GaN-based semiconductor laser device.

However, in operating the GaN-based semiconductor laser device using the GaN substrate, there arises a problem such that a current injected from the p-side electrode through the pad metal leaks without contributing to light emission, that is, the injection current flows so as to be short-circuited from the p-side electrode to the n-side electrode or to the ground.

As a result, a current-to-light conversion efficiency becomes low and there is also a case that no light is emitted.

The above problem is described by illustrating a GaN-based semiconductor light emitting device such as a semiconductor laser device. This problem, however, occurs also in a general GaN-based semiconductor device including not only a GaN-based semiconductor light emitting device, but an electron transit device, for example.

It is therefore an object of the present invention to provide a GaN-based semiconductor device using a GaN substrate which can reduce the current leak.

DISCLOSURE OF INVENTION

The present inventor has found the following fact during the process of investigating the causes of a large current leak in the GaN-based semiconductor laser device using the above-mentioned GaN substrate.

The present inventor has prepared a sample GaN-based semiconductor laser device similar in configuration to the GaN-based semiconductor laser device 10 shown in FIG. 5 except that a GaN substrate 46 having the above-mentioned characteristic is used in place of the sapphire substrate 12 and that a multilayer structure of GaN-based compound semiconductor layers is directly formed on the GaN substrate 46 without providing the GaN-ELO structure layer 14.

In the GaN-based semiconductor laser device 48 causing a large current leak, a pad metal (leading electrode) 37 on a p-side electrode 36 is formed at a position over a core portion 46a of the GaN substrate 46 as shown in FIG. 10. In an operation test with the sample GaN-based semiconductor laser device 48 at room temperature, it has been found that even when an injection current is increased by increasing an applied voltage as shown by the line (2) in FIG. 11B, the relation of injection current and optical output is flat in such a manner that the optical output is not increased, i.e., remains at substantially 0.0 mW as shown by the line (1) in FIG. 11B, that is, no laser oscillation occurs.

FIG. 11A is a plan view of the GaN-based semiconductor laser device, showing the relation between the positions of the laser stripe 30, the pad metal 37, and the n-side electrode 38 and the position of the core portion 46a. FIG. 11B is a graph showing the relation between injection current and optical output by the line (1) and the relation between injection current and applied voltage by the line (2), wherein the horizontal axis represents the injection current [mA] and the vertical axes represent the optical output [mW] and the applied voltage [V].

The present inventor has also found the following fact. Crystal dislocations in the core portion propagate into a region of the multilayer structure of the GaN-based compound semiconductor layers at a position over the core portion, and this region becomes a high-density defect region where the electrical resistance is low. Further, as shown in FIG. 12, the high-density defect region in this region of the multilayer structure over the core portion 46a is not epitaxially grown unlike the other region of the multilayer structure, and a step is produced on the surface. As a result, the $SiO_2$ film 34 formed under the pad metal 37 has a locally thin region at this step.

Accordingly, the injection current does not contribute to the light emission operation, but flows from the pad metal 37 through the high-density defect region in the multilayer structure to the GaN substrate 46, then being short-circuited through the conductive GaN substrate 46 to the n-side electrode 36 or to the ground. As a result, no laser oscillation occurs as apparent from the line (1).

In another GaN-based semiconductor laser device shown in FIG. 13A wherein the laser stripe 30, the pad metal 37 for the p-side electrode 36, and the n-side electrode 38 are arranged in a region except the core portion, the relation between injection current and optical output and the relation between injection current and applied voltage were measured. The results of this measurement are shown in FIG. 13B. As apparent from FIG. 13B, a clear threshold current value is indicated at an applied voltage of about 4 V, and the optical output is increased with an increase in the applied voltage and the injection current, thus causing the occurrence of laser oscillation.

Further, the present inventor has also found that as far as the pad metal 37 is not formed over the core portion, the current leak does not become so large even if the n-side electrode 36 is formed over the core portion.

In accordance with the present invention, there is provided a GaN-based semiconductor device including a GaN substrate having a low-density defect region and core portions present in the low-density defect region in a periodic planar arrangement on the substrate as a high-density defect region passing through substrate; a multilayer structure of GaN-based compound semiconductor layers formed on the GaN substrate; and an electrode portion having an electrode provided on the multilayer structure and a pad metal formed on an insulating film deposited on the electrode and electrically connected through an opening of the insulating film to the electrode; the electrode portion being provided on the multilayer structure in a region except the core portions of the GaN substrate.

In the GaN-based semiconductor device according to the present invention, the electrode portion having the electrode and the pad metal is provided on the multilayer structure in the region except the core portions of the GaN substrate rather than on the multilayer structure in a region over the core portion where the step is produced to cause a break in the insulating film, the electrode, etc. as examined in the above-mentioned operation test. With this arrangement, the current leak from the electrode or the pad metal can be prevented.

The periodic planar arrangement includes a continuous belt-shaped arrangement, an intermittent belt-shaped arrangement, and a dotted dispersive arrangement. For example, the core portions may be arranged on the substrate surface so as to extend like a continuous belt or like a continuous stripe as shown in FIG. 8A or 8B. Further, the dotted core portions may be dispersively arranged on the substrate surface as shown in FIGS. 7A to 7C.

The electrode is a p-side electrode or an n-side electrode provided on the multilayer structure. The electrode is connected through the opening of the insulating film to the pad metal provided as a leading electrode. The plan shape of the electrode is arbitrary as far as it has a predetermined electrode area. For example, the plan shape of the electrode may be striped or rectangular.

The plan shape of the pad metal is also arbitrary as far as it functions as a leading electrode. For example, the plan shape of the pad metal may be striped, rectangular, or circular. Further, the composition of the pad metal is also arbitrary as far as it functions as a leading electrode. For example, the pad metal may be provided by a multilayer metal film of Ti/Pt/Au.

Preferably, the core portions of the GaN substrate are largely spaced from each other, and the electrode portion is provided on the multilayer structure in the low-density defect region between the core portions adjacent to each other.

If at least a part of the electrode portion is provided on the multilayer structure at a position over the core portions of the GaN substrate, the effect of the present invention is difficult to obtain. In other words, it is important that the electrode portion is to be provided on the multilayer structure precisely in the region except the core portions of the GaN substrate.

Preferably, according to the above-mentioned result of investigation on the GaN substrate, the electrode portion is provided on the multilayer structure in the region at a position spaced apart from the center of each core portion by a distance of 100 µm or more.

While the pad metal may be spaced apart from the outer edge of each core portion by a distance of 50 µm or less, the electrode is preferably provided on the multilayer structure in the region at a position spaced apart from the outer edge of each core portion by a distance of 50 µm or more. With this arrangement, the current leak can be suppressed more reliably.

A counter electrode to the electrode may be provided on the back surface of the GaN substrate. Alternatively, a counter electrode to the electrode may be provided on the multilayer structure.

In the case that the counter electrode is provided on the multilayer structure, both the electrode and the counter electrode are provided on the multilayer structure in the region except the core portion. With this arrangement, the current leak can be further suppressed.

The present invention is generally applicable to a GaN-based semiconductor device. More specifically, the present invention is applicable to a GaN-based semiconductor light emitting device including a GaN-based light emitting diode and a GaN-based semiconductor laser device. Further, as far as the pad metal is electrically connected through the opening of the insulating film to the stripe electrode, the structure of the laser stripe is not limited.

Further, the present invention is applicable also to an electron transit device using a GaN-based compound semiconductor such as a GaN-based FET and a GaN-based heterojunction bipolar transistor (HBT).

Further, the compositions of metals forming the electrode, the counter electrode, and the pad metal are not limited.

The GaN-based compound semiconductor mentioned in the present invention is a compound semiconductor having nitrogen (N) as a V-group element and a composition represented by $Al_a B_b Ga_c In_d N_x P_y As_z$ (a+b+c+d=1, $0 \leq a, b, c, d \leq 1$, x+y+z=1, $0 < x \leq 1$, $0 \leq y, z \leq 1$).

BRIEF DESCRIPTION OF DRAWINGS

FIG. 1A is a sectional view showing the configuration of a GaN-based semiconductor laser device according to a first preferred embodiment of the present invention and FIG. 1B is a plan view showing the positional relation among a pad metal for a p-side electrode, an n-side electrode, and core portions in the GaN-based semiconductor laser device shown in FIG. 1A.

BEST MODE FOR CARRYING OUT THE INVENTION

Some preferred embodiments of the present invention will now be described specifically in detail with reference to the attached drawings. The film deposition method and the compositions of compound semiconductor layers, for example, as described in each preferred embodiment are merely illustrative for ease of understanding of the present invention, and the present invention is not limited by such an illustration.

First Preferred Embodiment

This preferred embodiment is a preferred embodiment wherein the GaN-based semiconductor device according to the present invention is applied to a GaN-based semiconductor laser device. FIG. 1A is a sectional view showing the configuration of a GaN-based semiconductor laser device according to the first preferred embodiment, and FIG. 1B is a plan view showing the positional relation among a pad metal for a p-side electrode, an n-side electrode, and core portions in the GaN-based semiconductor laser device shown in FIG. 1A.

Figure 9:
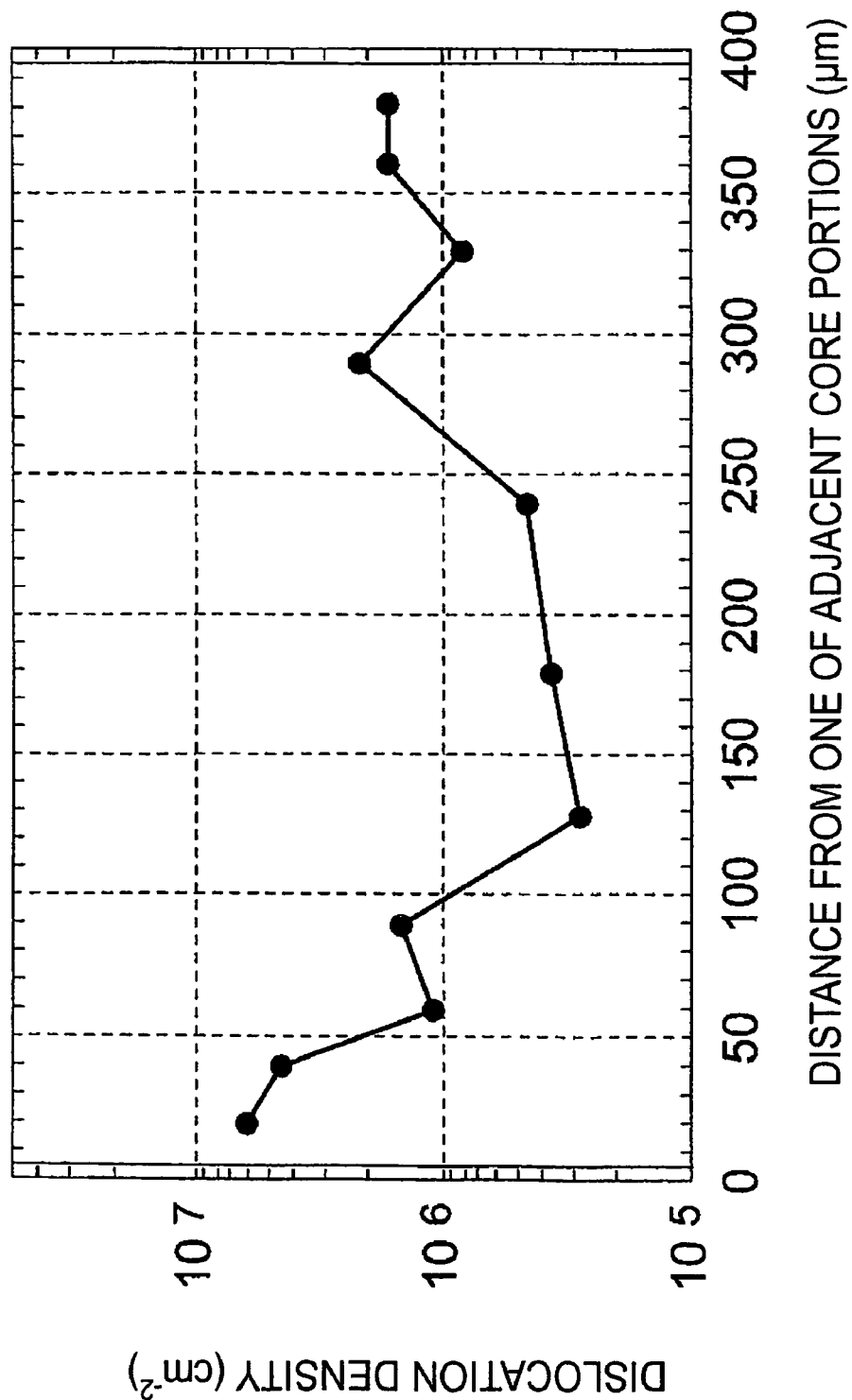
FIG. 9 is a graph showing a dislocation density.
Figure 10:
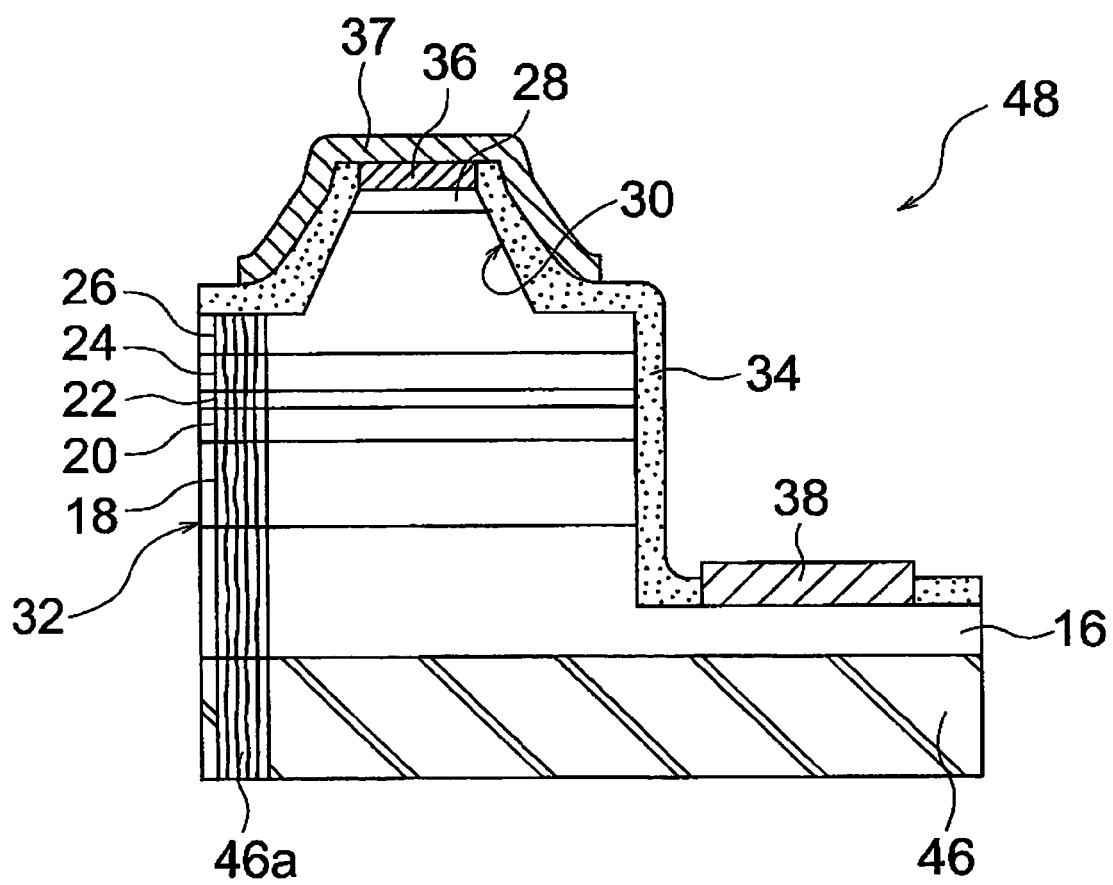
FIG. 10 is a sectional view showing the configuration of a sample GaN-based semiconductor laser device.
Figure 11A:
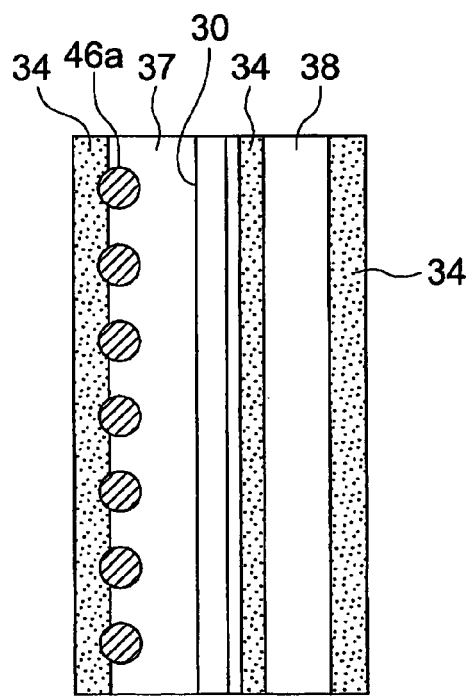
FIG. 11A is a plan view of the GaN-based semiconductor laser device, showing the relation between the positions of a laser stripe, pad metal, and n-side electrode and the position of a core portion
Figure 11B:
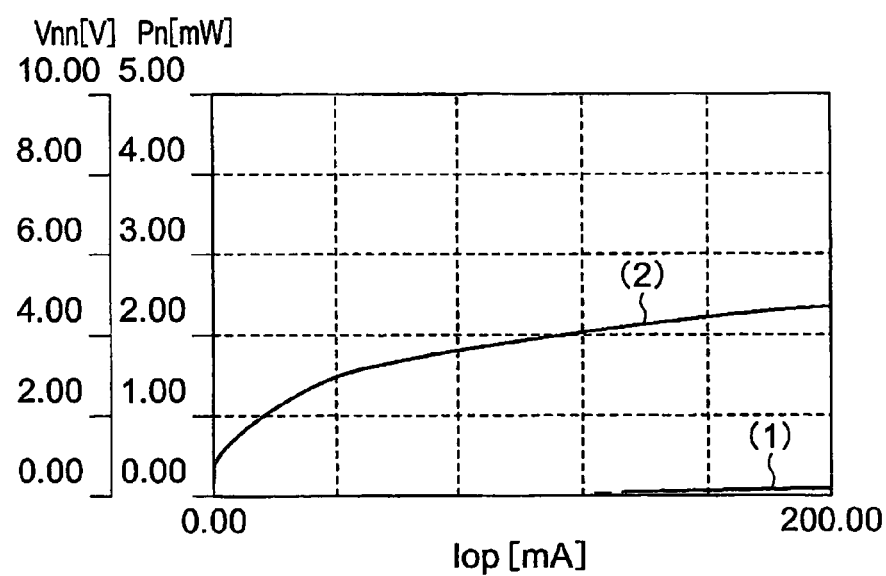
FIG. 11B is a graph showing the relation between injection current and optical output by the line (1) and the relation between injection current and applied voltage by the line (2) in the laser device, wherein the horizontal axis represents the injection current [mA] and the vertical axes represent the optical output [mW] and the applied voltage [V].
Figure 12:
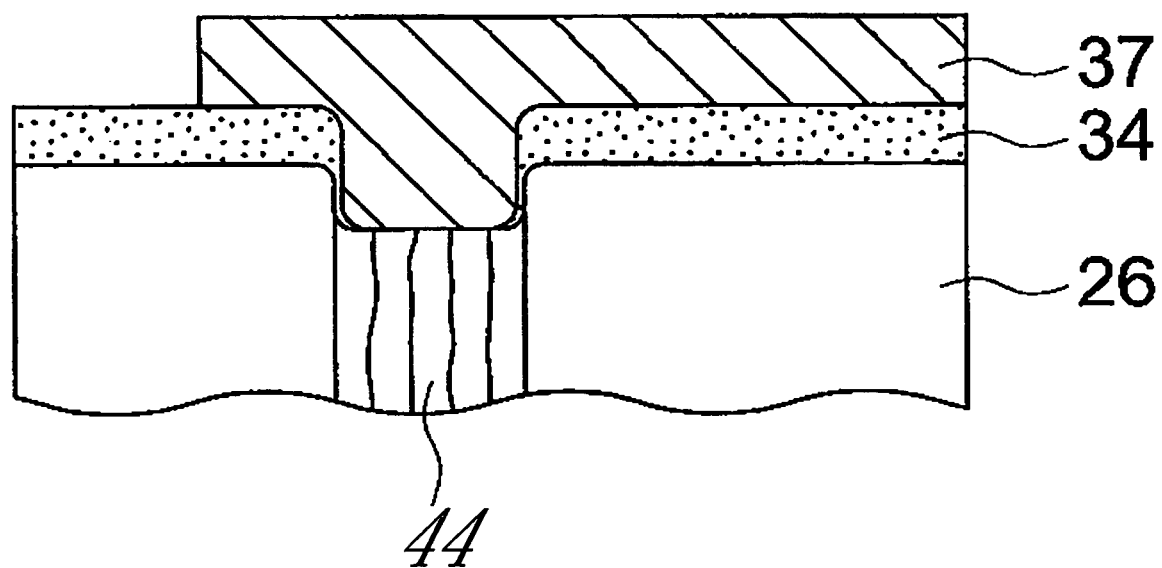
FIG. 12 is a sectional view for illustrating a condition where the thickness of an insulating film is reduced at a position over a high-density defect region in a multilayer structure.
Figure 13A:
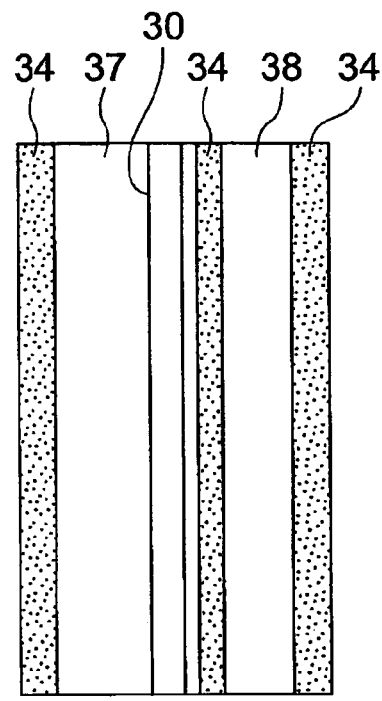
FIG. 13A is a plan view of another GaN-based semiconductor laser device, showing the relation between the positions of a laser stripe, pad metal, and n-side electrode and the position of a core portion
Figure 13B:
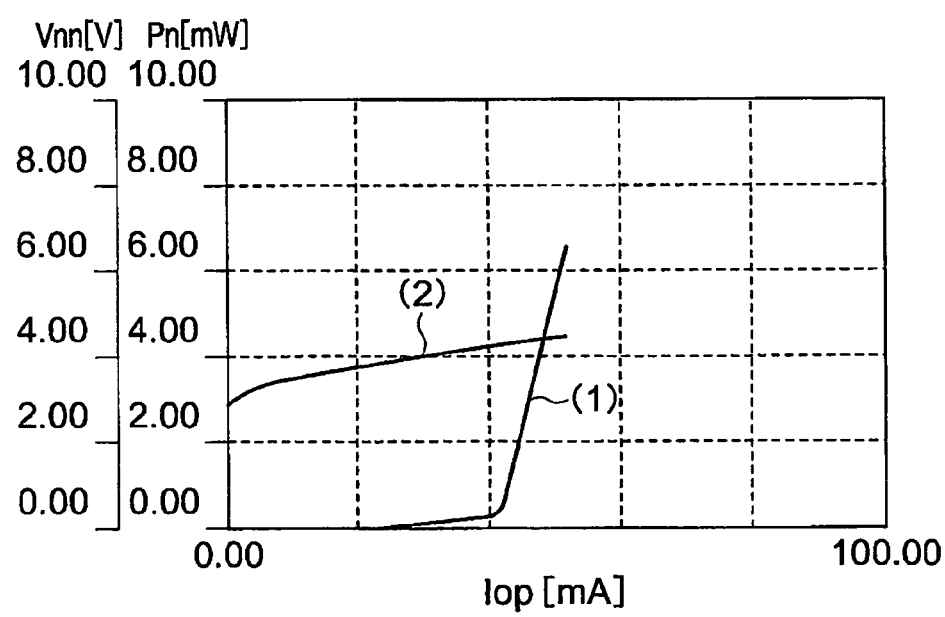
FIG. 13B is a graph showing the relation between injection current and optical output by the line (1) and the relation between injection current and applied voltage by the line (2) in the laser device, wherein the horizontal axis represents the injection current [mA] and the vertical axes represent the optical output [mW] and the applied voltage [V].

The GaN-based semiconductor laser device 50 is a semiconductor laser device having a structure such that both the p-side electrode and the n-side electrode are provided on the multilayer structure for the convenience of mounting of the semiconductor laser device. As shown in FIG. 1A, the GaN-based semiconductor laser device 50 is similar in configuration to the GaN-based semiconductor laser device 10 shown in FIG. 5 except that a novel GaN substrate 52 having the above-mentioned characteristic shown in FIG. 9 is used in place of the sapphire substrate 12 and that the multilayer structure of the GaN-based compound semiconductor layers are directly formed on the GaN substrate 52 without providing the GaN-ELO structure layer 14.

Figure 5:
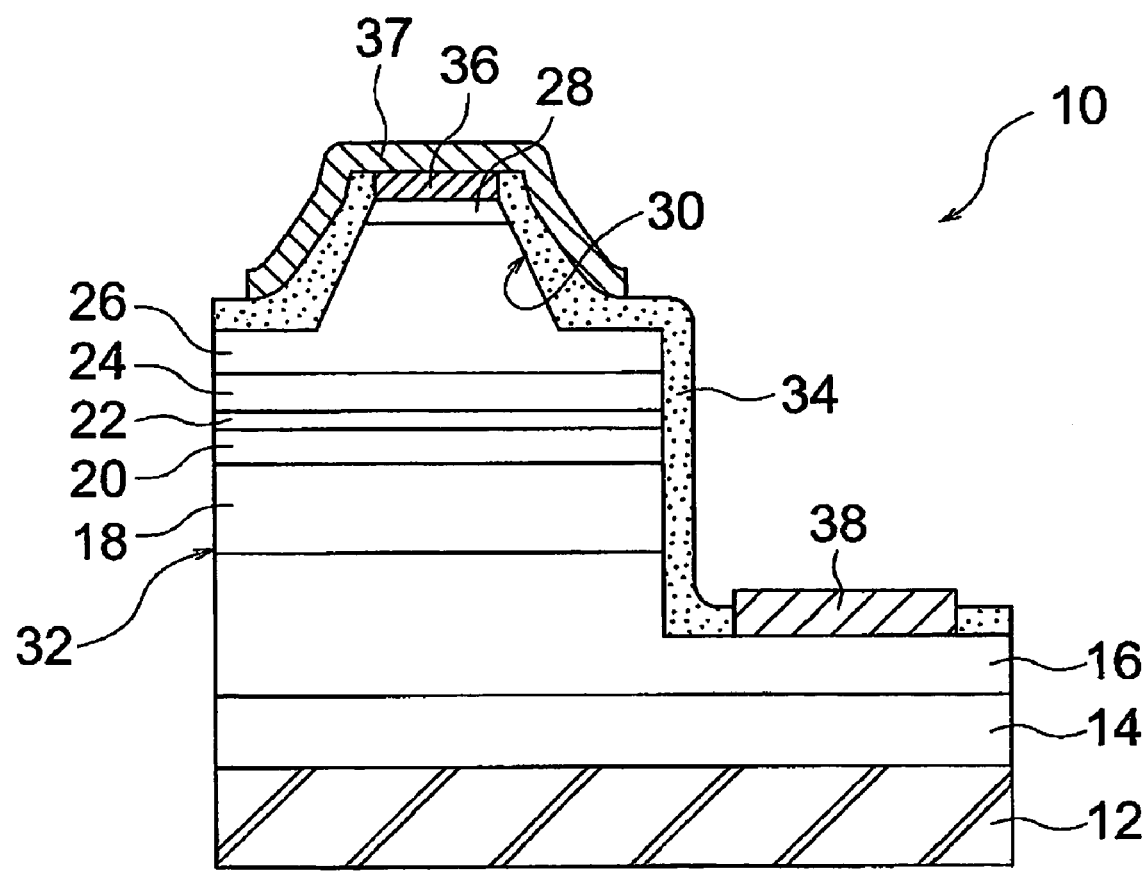
FIG. 5 is a sectional view showing the configuration of a GaN-based semiconductor laser device formed on a sapphire substrate.
Figure 6A:
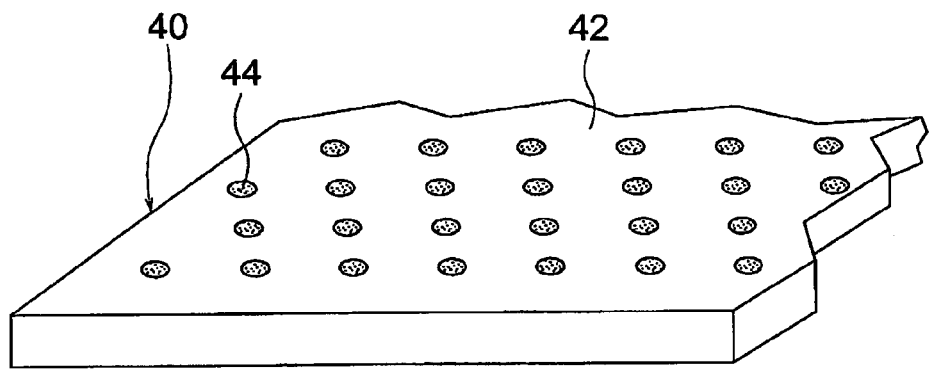
FIGS. 6A and 6B are a perspective view and a sectional view of a GaN substrate, respectively, for illustrating core portions and a low-density defect region.
Figure 6B:
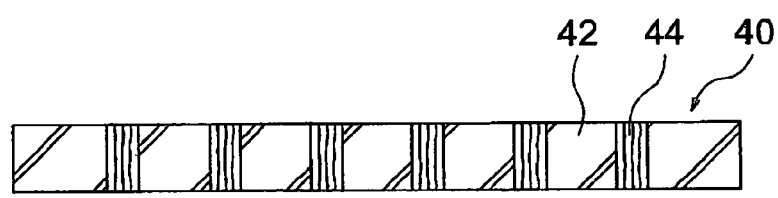

Further, as similar to the GaN-based semiconductor laser device 10 shown in FIG. 5, the electrode portion has a p-side electrode 36 and a pad metal 37 electrically connected through the opening of the $SiO_2$ film 34 to the p-side electrode 36. The pad metal 37 serves as a leading electrode for the p-side electrode 36. The pad metal 37 is wider than the p-side electrode 36. The composition of the pad metal 37 is Ti/Pt/Au.

As shown in FIG. 1B, the GaN substrate 52 has dot-shaped or continuous belt-shaped core portions 52a each having a width of 10 μm, for example. The core portions 52a are spaced apart from each other by a distance of about 400 μm.

As shown in FIGS. 1A and 1B, the laser stripe 30 and the p-side electrode portion (to be represented by the pad metal 37) having the p-side electrode 36 and the pad metal 37 are provided on the multilayer structure in a region except the core portions 52a of the GaN substrate 52, and the n-side electrode 38 is also provided on the multilayer structure in this region.

The left side edge of the p-side electrode portion (the pad metal 37) is spaced apart from the center of the left core portion 52a by a distance of 100 μm. Similarly, the right side edge of the n-side electrode 38 is spaced apart from the center of the right core portion 52a by a distance of 100 μm. Accordingly, the horizontal distance Sp between the left side edge of the pad metal 37 and the right side edge of the left core portion 52a is 95 μm, and the horizontal distance Sn between the right side edge of the n-side electrode 38 and the left side edge of the right core portion 52a is also 95 μm. The p-side electrode 36 is spaced apart from the right side edge of the left core portion 52a by a distance of 50 μm or more.

A fabrication method for the GaN-based semiconductor laser device 50 according to this preferred embodiment will now be described with reference to FIGS. 2A to 2C and FIGS. 3A and 3B. FIGS. 2A to 2C and FIGS. 3A and 3B are sectional views showing a series of steps of the fabrication method for the GaN-based semiconductor laser device 50.

As the first step of the fabrication method for the GaN-based semiconductor laser device 50, a GaN substrate 52 having core portions 52a spaced apart from each other by a distance of about 400 μm is prepared.

Figure 2A:
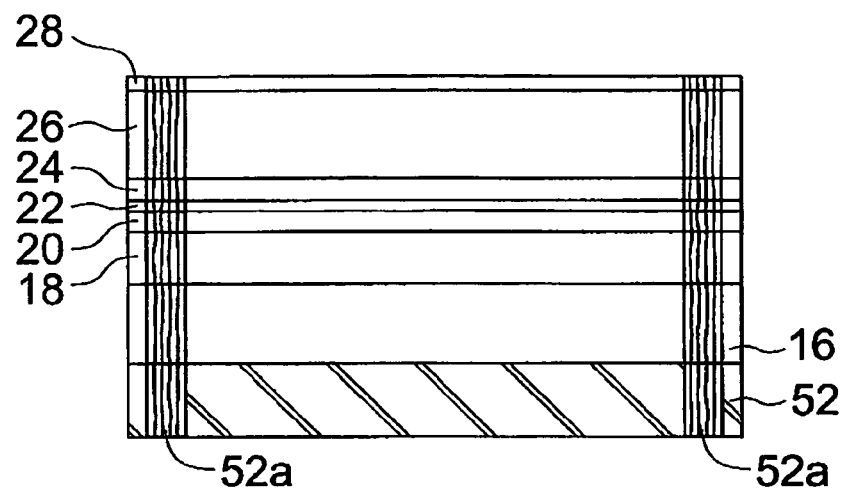
FIGS. 2A to 2C are sectional views showing a series of steps of a fabrication method for the GaN-based semiconductor laser device according to the first preferred embodiment.

As shown in FIG. 2A, an n-type GaN contact layer 16, n-type AlGaN clad layer 18, n-type GaN guide layer 20, GaInN active layer 22 having a multiple quantum well (MQW) structure, p-type GaN guide layer 24, p-type AlGaN clad layer 26, and p-type GaN contact layer 28 are sequentially epitaxially grown on the GaN substrate 52 by MOCVD, for example, thereby forming a multilayer structure.

As shown in FIG. 2A, the defects such as dislocations in the core portions 52a propagate into the multilayer structure to form a high-density defect region.

As the next step, the multilayer structure is cleaned with acetone to remove organic matter as a pretreatment for activation of the p-type compound semiconductor layers. Thereafter, a UV ozone treatment is carried out to deposit a thin oxide film on the multilayer structure.

As the next step, annealing is carried out at a temperature of about 400° C. to perform dehydogenation and activation of Mg as a p-type impurity, thus performing the activation of the p-type compound semiconductor layers.

As a posttreatment for the above activation, cleaning by means of KOH is carried out and the oxide film deposited in the pretreatment for the activation is next removed by an HF-based gas treatment.

Figure 2B:
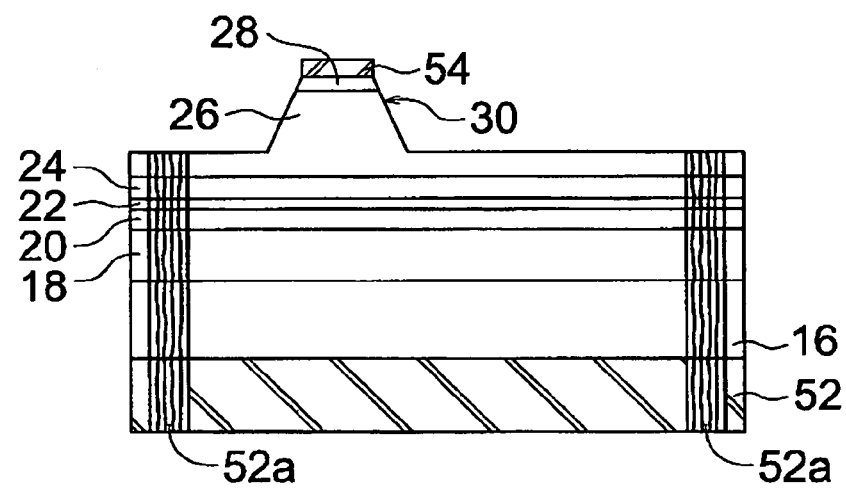

An $SiO_2$ film is next deposited on the p-type GaN contact layer 28 by vacuum evaporation, and as shown in FIG. 2B the $SiO_2$ film is next patterned to form a stripe-shaped $SiO_2$ film mask 54.

Then, the p-type GaN contact layer 28 and an upper portion of the p-type AlGaN clad layer 26 are etched by using the $SiO_2$ film mask 54 to thereby form a stripe-shaped ridge 30 at a position spaced apart from the core portions 52a as shown in FIG. 2B.

Figure 2C:
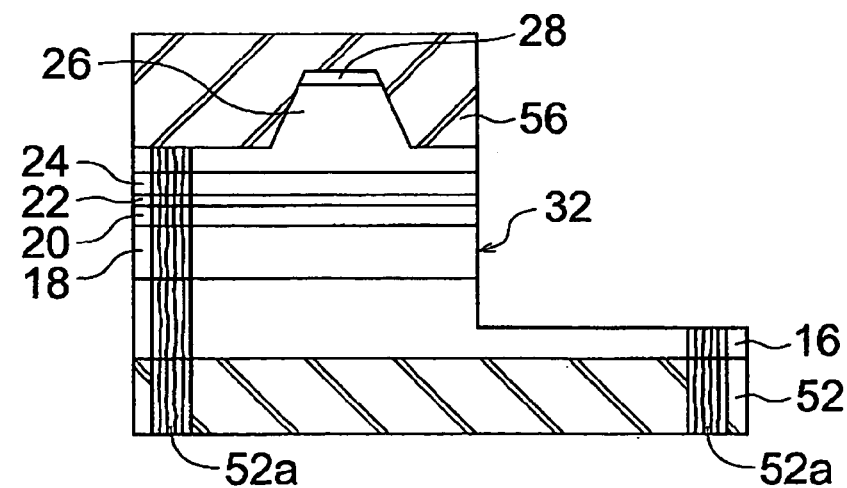
Figure 3A:
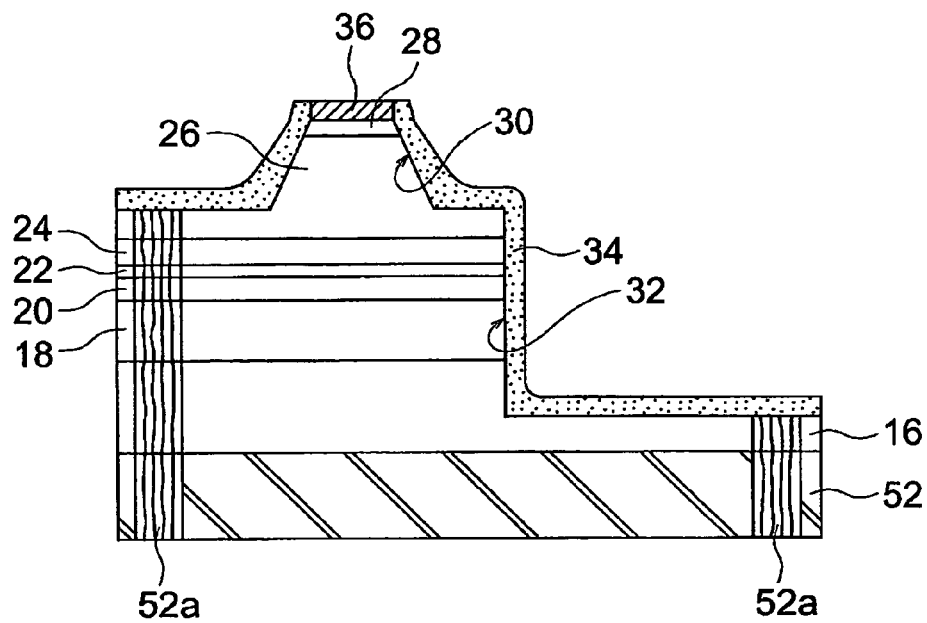
FIGS. 3A and 3B are sectional views showing a series of steps of a fabrication method for the GaN-based semiconductor laser device according to the first preferred embodiment, subsequent to FIG. 2C.
Figure 3B:
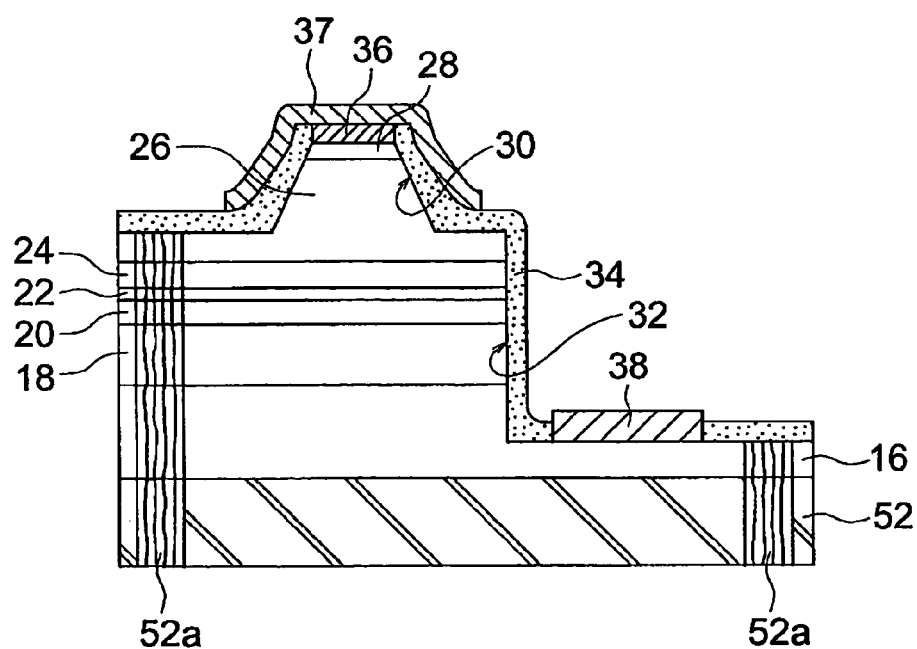

As the next step, the $SiO_2$ film mask 54 is removed and another $SiO_2$ film is next deposited on the multilayer structure by vacuum evaporation. This $SiO_2$ film is next patterned to form a mask 56. Then, a lower portion of the p-type AlGaN clad layer 26, the p-type GaN guide layer 24, the active layer 22, the n-type GaN guide layer 20, the n-type GaN clad layer 18, and an upper portion of the n-type GaN contact layer 16 are etched by using the mask 56 as shown in FIG. 2C, thereby forming a mesa 32 extending in the same direction as that of the stripe-shaped ridge 30 at a position largely spaced apart from the right core portion 52a.

After removing the mask 56, an $SiO_2$ film 34 is next deposited on the multilayer structure. The $SiO_2$ film 34 is next opened at a position over the p-type GaN contact layer 28 by lithography and etching. Then, a lift-off process is applied to form a p-type electrode 36 as shown in FIG. 3D.

As the next step, lithography, etching, and lift-off processes are carried out to form a pad metal 37 as a p-side leading electrode electrically connected to the p-side electrode 36 as shown in FIG. 3E. At this time, the horizontal distance between the left side edge of the pad metal 37 and the right side edge of the left core portion 52a is set to at least 0 μm, preferably 95 μm as in this preferred embodiment.

As the next step, lithography, etching, and lift-off processes are carried out to form an n-side electrode 38 at a position spaced apart from the left side edge of the right core portion 52a, preferably by a distance of 95 μm as in this preferred embodiment.

In the GaN-based semiconductor laser device 50 according to this preferred embodiment, the laser stripe 30, the pad metal 37 for the p-side electrode 36, and the n-side electrode 38 are provided on the multilayer structure in the region except the core portions 52a of the GaN substrate 52. Accordingly, the current leak can be suppressed to improve the current-to-light conversion efficiency.

Second Preferred Embodiment

Figure 4A:
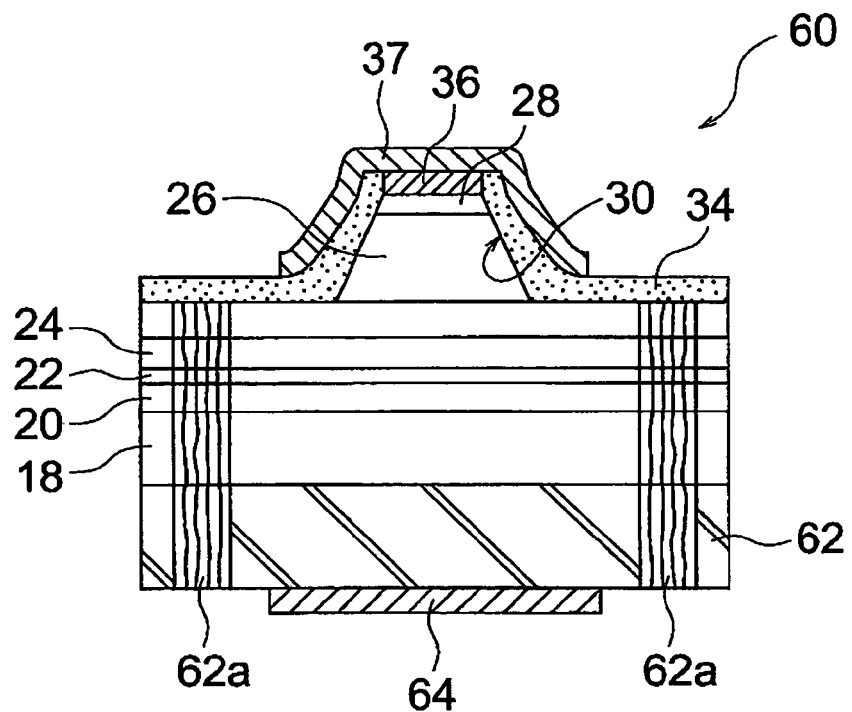
FIG. 4A is a sectional view showing the configuration of a GaN-based semiconductor laser device according to a second preferred embodiment of the present invention and FIG. 4B is a plan view showing the positional relation among a pad metal for a p-side electrode, an n-side electrode, and core portions in the GaN-based semiconductor laser device.

This preferred embodiment is another preferred embodiment wherein the GaN-based semiconductor device according to the present invention is applied to a GaN-based semiconductor laser device. FIG. 4A is a sectional view showing the configuration of a GaN-based semiconductor laser device according to the second preferred embodiment, and FIG. 4B is a plan view showing the positional relation among a pad metal for a p-side electrode, an n-side electrode, and core portions in the GaN-based semiconductor laser device.

The GaN-based semiconductor laser device 60 is a semiconductor laser device having a structure such that the p-side electrode is provided on the multilayer structure, and the n-side electrode is provided on the back surface of the substrate. As shown in FIG. 4A, the GaN-based semiconductor laser device 60 is similar in configuration to the GaN-based semiconductor laser device 10 shown in FIG. 5 except that a novel GaN substrate 62 having the above-mentioned characteristic shown in FIG. 9 is used in place of the sapphire substrate 12, that the multilayer structure of the GaN-based compound semiconductor layers are directly formed on the GaN substrate 62 without providing the GaN-ELO structure layer 14, that the n-type GaN contact layer 16 is not provided, and that the n-side electrode is provided on the back surface of the substrate.

In other words, as shown in FIG. 4A, the GaN-based semiconductor laser device 60 includes the GaN substrate 62, the multilayer structure of an n-type AlGaN clad layer 18, n-type GaN guide layer 20, GaInN active layer 22 having a multiple quantum well (MQW) structure, p-type GaN guide layer 24, p-type AlGaN clad layer 26, and p-type GaN contact layer 28 sequentially grown on the GaN substrate 62 by MOCVD, and an electrode portion having a p-side electrode 36 and a pad metal 37.

Figure 4B:
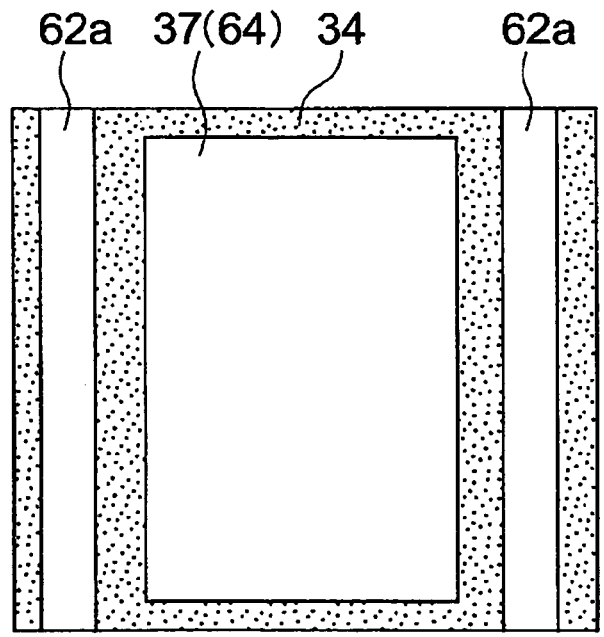

As shown in FIG. 4B, the GaN substrate 62 has continuous belt-shaped core portions 62a each having a width of 10 μm. The core portions 62a are spaced apart from each other by a distance of about 400 μm.

An upper portion of the p-type AlGaN clad layer 26 and the p-type GaN contact layer 28 are formed as a stripe-shaped ridge 30 located between the core portions 62a adjacent to each other.

An SiO$_2$ film 34 having an opening at a position over the p-type GaN contact layer 28 is deposited on both side surfaces of the ridge 30 and a lower or remaining portion of the p-type AlGaN clad layer 26.

The p-side electrode 36 of a Pd/Pt/Au multilayer metal film is formed on the p-type GaN contact layer 28, and the pad metal 37 electrically connected through the opening of the SiO$_2$ film 34 to the p-side electrode 36 is provided as a p-side leading electrode on the SiO$_2$ film 34.

As shown in FIGS. 4A and 4B, the laser stripe 30, the p-side electrode portion (to be represented by the pad metal 37) having the p-side electrode 36 and the pad metal 37 and the n-side electrode 64 are provided on the multilayer structure in a region except the core portions 62a of the GaN substrate 62.

The left side edge of the p-side electrode portion (the pad metal 37) is spaced apart from the center of the left core portion 62a by a distance of 100 μm, and the right side edge of the p-side electrode portion (the pad metal 37) is also spaced apart from the center of the right core portion 62a by a distance of 100 μm. Similarly, the left side edge of the n-side electrode 64 is spaced apart from the center of the left core portion 62a by a distance of 100 μm, and the right side edge of the n-side electrode 64 is also spaced apart from the center of the right core portion 62a by a distance of 100 μm. Accordingly, the horizontal distance Sp between the left side edge of the pad metal 37 and the right side edge of the left core portion 62a or between the right side edge of the pad metal 37 and the left side edge of the right core portion 62a is 95 μm, and the horizontal distance Sn between the left side edge of the n-side electrode 64 and the right side edge of the left core portion 62a or between the right side edge of the n-side electrode 64 and the left side edge of the right core portion 62a is also 95 μm. Further, the p-side electrode 36 is spaced apart from the right side edge of the left core portion 62a or the left side edge of the right core portion 62a by a distance of 50 μm or more.

In fabricating the GaN-based semiconductor laser device 60, a GaN substrate 62 having core portions 62a spaced apart from each other by a distance of about 400 μm is first prepared. Thereafter, an n-type AlGaN clad layer 18, n-type GaN guide layer 20, GaInN active layer 22 having a multiple quantum well (MQW) structure, p-type GaN guide layer 24, p-type AlGaN clad layer 26, and p-type GaN contact layer 28 are sequentially epitaxially grown on the GaN substrate 62 by MOCVD, for example, thereby forming a multilayer structure.

As in the fabrication process for the GaN-based semiconductor laser device 50 according to the first preferred embodiment, a pretreatment for activation of the p-type compound semiconductor layers, an activation process for the p-type compound semiconductor layers, and a posttreatment for the activation are sequentially applied to the multilayer structure.

As in the case of the GaN-based semiconductor laser device 50, a stripe-shaped ridge 30 is next formed, and an SiO$_2$ film 34 is next deposited on the multilayer structure. Then, this SiO$_2$ film 34 is next opened at a position over the p-type GaN contact layer 28 by lithography and etching. Then, a lift-off process is applied to form a p-type electrode 36.

Thereafter, lithography, etching, and lift-off processes are carried out to form a pad metal 37 as a p-side leading electrode electrically connected to the p-side electrode 36 as shown in FIG. 3E. At this time, the horizontal distance between the left side edge of the pad metal 37 and the right side edge of the left core portion 62a or between the right side edge of the pad metal 37 and the left side edge of the right core portion 62a is set to at least 0 μm, preferably 95 μm as in this preferred embodiment.

Thereafter, the back surface of the GaN substrate 62 is polished to adjust the thickness of the substrate to a predetermined thickness, and an n-side electrode 64 is formed on the back surface of the GaN substrate 62 at a position spaced apart from the right side edge of the left core portion 62a or the left side edge of the right core portion 62a by a distance of at least 0 μm, preferably 95 μm as in this preferred embodiment.

In the GaN-based semiconductor laser device 60 according to this preferred embodiment, the laser stripe 30, the pad metal 37 for the p-side electrode 36 and the n-side electrode 64 are provided on the multilayer structure in the region 62a of the GaN substrate 62. Accordingly, the current leak can be suppressed to improve the current-to-light conversion efficiency.

Figure 7A:
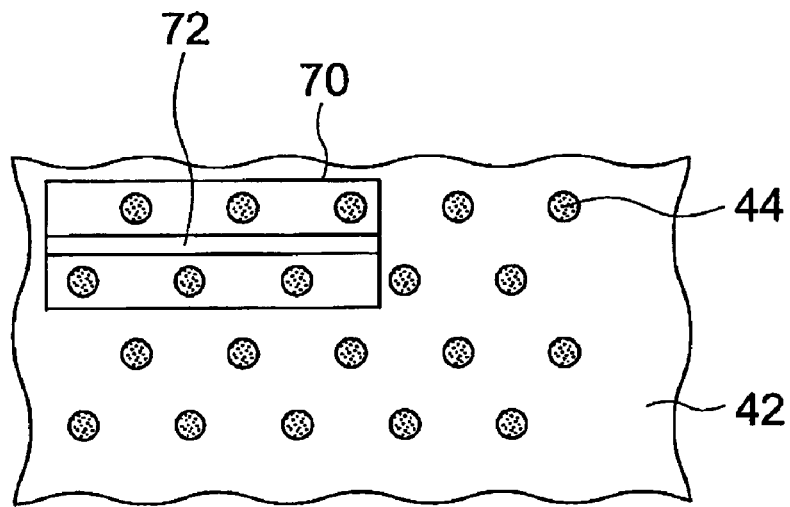
FIGS. 7A to 7C are plan views showing various dispersive arrangements of dotted core portions.
Figure 7B:
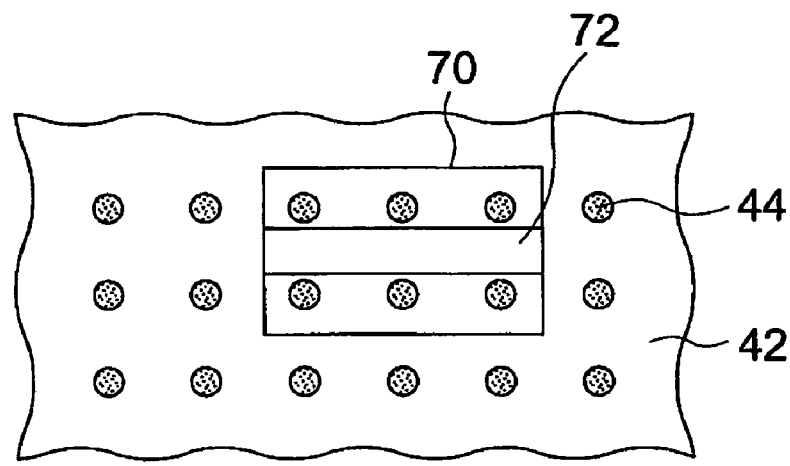
Figure 7C:
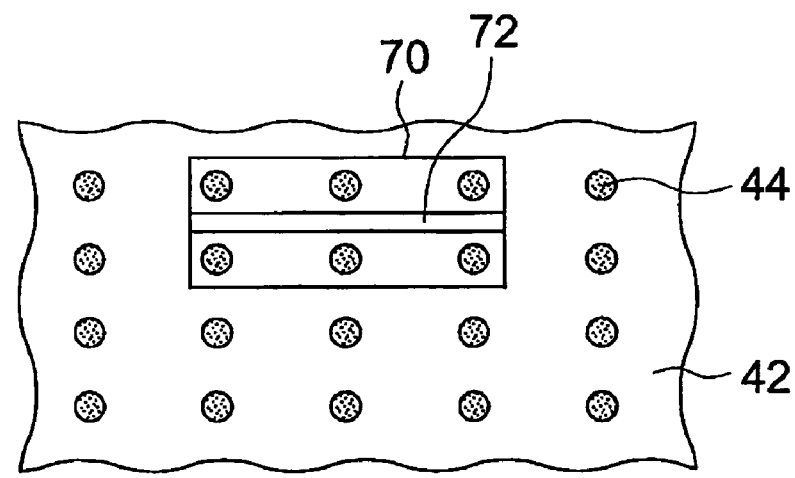
Figure 8A:
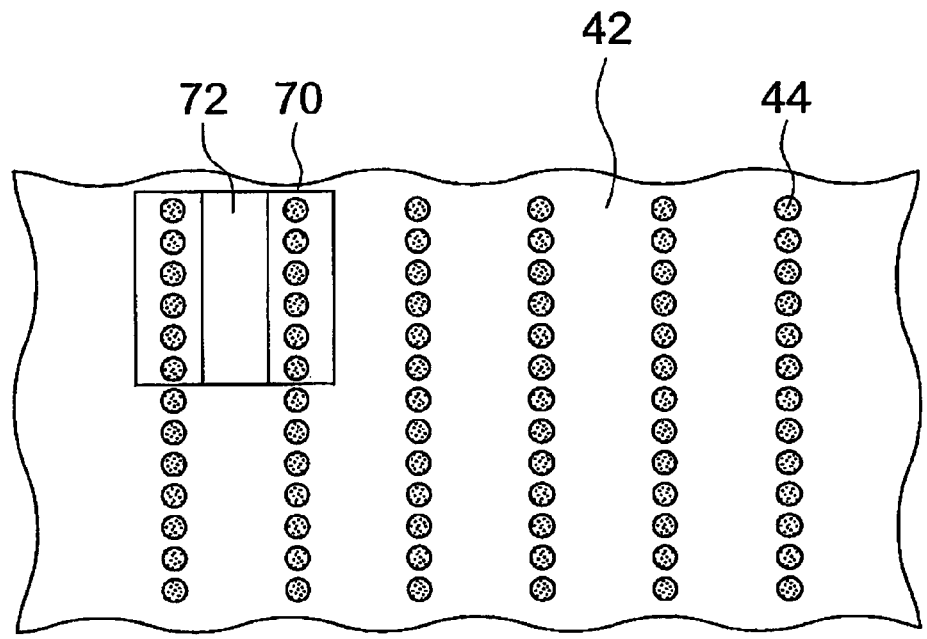
FIGS. 8A and 8B are plan views showing intermittent and continuous arrangements of striped core portions, respectively.
Figure 8B:
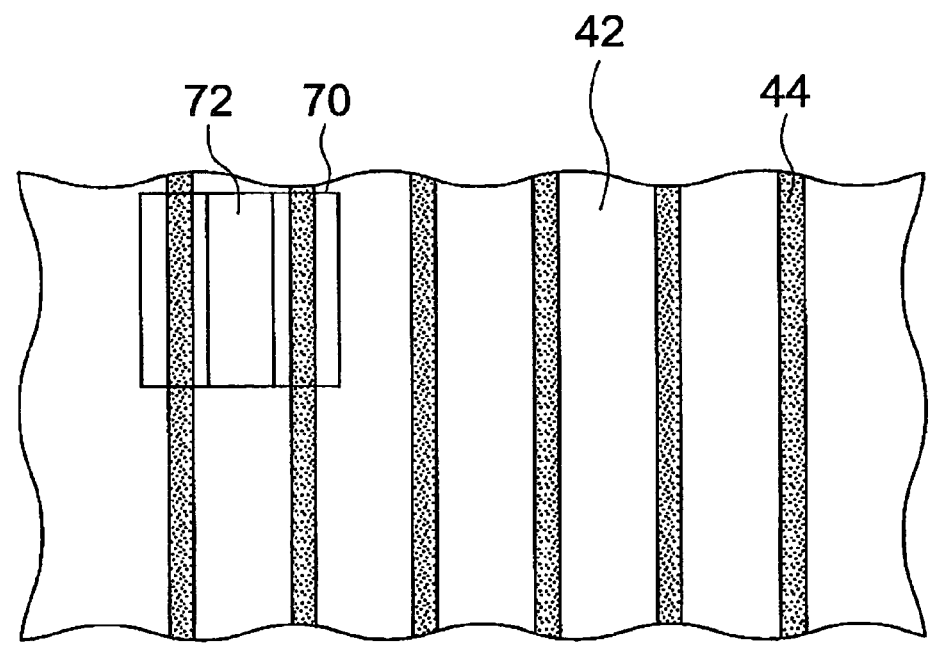

While the GaN substrate having the continuous belt-shaped core portions is used in each of the first and second preferred embodiments, any GaN substrates having various core portions arranged on a plane as shown in FIGS. 7 and 8 may be used. In each of FIGS. 7 and 8, reference numeral 70 denotes a substrate region, and reference numeral 72 denotes a region for forming a laser stripe, pad metal, and n-side electrode.

While the GaN-based semiconductor laser device in each preferred embodiment is of an air ridge type, the present invention is applicable also to an buried type GaN-based semiconductor laser device.

Further, while the GaN-based semiconductor laser device in each preferred embodiment includes a stripe-shaped p-side electrode, the present invention is applicable also to a GaN-based semiconductor laser device having an unstriped electrode and to a GaN-based light emitting diode.

Further, the present invention is applicable also to an electron transit device using a GaN-based compound semiconductor such as a GaN-based FET and a GaN-based heterojunction bipolar transistor (HBT).

INDUSTRIAL APPLICABILITY

According to the present invention, a GaN substrate having a low-density defect region and core portions present in the low-density defect region in a periodic planar arrangement on the substrate is used. In forming a GaN-based semiconductor device having a multilayer structure on the GaN substrate, an electrode portion is provided on the multilayer structure in a region except the core portions of the GaN substrate. The electrode portion has an electrode provided on the multilayer structure and a pad metal provided as a leading electrode for the above electrode on an insulating film deposited on the above electrode. With this configuration, the leak of an injection current can be suppressed to improve the light emission efficiency of the GaN-based semiconductor device.

The invention claimed is:

1. A GaN-based semiconductor device comprising:
   a GaN substrate having a low-density defect region and at least one core portion surrounded by said low-density defect region that is a high-density defect region;
   a multilayer structure of GaN-based compound semiconductor layers formed on said GaN substrate;
   an electrode portion provided on said multilayer structure and a pad metal formed over said electrode and an insulating film, the pad metal being electrically connected through an opening of said insulating film to said electrode;
   said electrode portion being provided on said multilayer structure in a region such that it does not overlap in the depth direction any portion of said core portion of said GaN substrate; and further wherein the pad metal extends beyond a lateral edge of the electrode and the pad metal does not overlap in the depth direction any portion of said core portion.

2. A GaN-based semiconductor device according to claim 1, wherein a plurality of core portions are arranged in at least one of a continuous belt-shaped arrangement, an intermittent belt-shaped arrangement, and a dotted dispersive arrangement.

3. A GaN-based semiconductor device according to claim 1, wherein said electrode portion is provided on said multilayer structure in said low-density defect region between core portions adjacent to each other.

4. A GaN-based semiconductor device according to claim 1, wherein said pad metal is provided on said multilayer structure at a position that is laterally spaced apart from a center of each core portion by a distance of 100 μm or more.

5. A GaN-based semiconductor device according to claim 1, wherein said electrode is provided on said multilayer structure at a position that is laterally spaced apart from an outer edge of each core portion by a distance of 50 μm or more.

6. A GaN-based semiconductor device according to claim 1, wherein a counter electrode to said electrode is provided on a back surface of said GaN substrate.

7. A GaN-based semiconductor device according to claim 1, wherein a counter electrode to said electrode is provided on said multilayer structure.

8. A GaN-based semiconductor device according to claim 7, wherein both said electrode and said counter electrode are provided on said multilayer structure such that they do not overlap in the depth direction any portion of said core portions of said GaN substrate.

9. A GaN-based semiconductor device according to claim 8, wherein said electrode is one of a p-side electrode and an n-side electrode, and said counter electrode is the other of said p-side electrode and said n-side electrode.

10. A GaN-based semiconductor device according to claim 1, wherein said GaN-based semiconductor device comprises a GaN-based semiconductor light emitting device including a GaN-based semiconductor laser device and a GaN-based light emitting diode.

11. A GaN-based semiconductor device comprising:
    a GaN substrate having a low-density defect region and at least one core portion surrounded by said low-density defect region that is a high-density defect region;
    a multilayer structure of GaN-based compound semiconductor layers formed on said GaN substrate;
    an electrode portion provided on said multilayer structure and a pad metal formed over said electrode and an insulating film, the pad metal being electrically connected through an opening of said insulating film to said electrode; and further wherein the pad metal extends beyond a lateral edge of the electrode and the pad metal does not overlap in the depth direction any portion of said core portion.

12. A GaN-based semiconductor device comprising:
    a GaN substrate having a low-density defect region and at least one core portion surrounded by said low-density defect region that is a high-density defect region;
    a multilayer structure of GaN-based compound semiconductor layers formed on said GaN substrate;
    a first electrode portion provided on said multilayer structure and a pad metal formed over said first electrode and an insulating film, the pad metal being electrically connected through an opening of said insulating film to said electrode; wherein the pad metal extends beyond a lateral edge of the electrode and the pad metal does not overlap in the depth direction any portion of said core portion; and
    a second electrode formed over the GaN substrate adjacent to the multilayer structure and wherein the low-density defect region of the substrate extends continuously from a region beneath an outer portion of the pad metal to the region beneath the second electrode.

* * * * *